(12) United States Patent
Tippmann

(10) Patent No.: US 9,148,986 B2
(45) Date of Patent: Sep. 29, 2015

(54) MULTI-CURVED, UNIBODY FIBERGLASS TOUCHSCREEN KIOSK WITH INTERCHANGEABLE COMPONENT CAGES

(71) Applicant: Werks Manufacturing, Inc., Fort Wayne, IN (US)

(72) Inventor: Joseph D. Tippmann, Fort Wayne, IN (US)

(73) Assignee: Werks Manufacturing, Inc, Fort Wayne, IN (US)

( * ) Notice: Subject to any disclaimer, the term of this patent is extended or adjusted under 35 U.S.C. 154(b) by 141 days.

(21) Appl. No.: 14/146,204

(22) Filed: Jan. 2, 2014

(65) Prior Publication Data

US 2014/0185205 A1    Jul. 3, 2014

Related U.S. Application Data

(60) Provisional application No. 61/748,247, filed on Jan. 2, 2013.

(51) Int. Cl.
| | |
|---|---|
| *H05K 13/04* | (2006.01) |
| *G06Q 30/06* | (2012.01) |
| *G09F 27/00* | (2006.01) |
| *G07F 17/00* | (2006.01) |
| *G06Q 30/00* | (2012.01) |
| *G06Q 90/00* | (2006.01) |

(52) U.S. Cl.
CPC .............. *H05K 13/04* (2013.01); *G06Q 30/00* (2013.01); *G06Q 30/0641* (2013.01); *G06Q 90/20* (2013.01); *G07F 17/0014* (2013.01); *G09F 27/00* (2013.01); *Y10T 29/49826* (2015.01)

(58) Field of Classification Search
CPC ...................................... H05K 13/04
USPC .......................... 361/679.1; 29/428
See application file for complete search history.

(56) References Cited

U.S. PATENT DOCUMENTS

| | | | | |
|---|---|---|---|---|
| D616,108 | S * | 5/2010 | Schmidt-Schaeffer | D25/16 |
| 2002/0194793 | A1* | 12/2002 | Bowron | 52/36.1 |
| 2009/0233714 | A1* | 9/2009 | Toro | 463/39 |
| 2011/0147194 | A1* | 6/2011 | Kamen et al. | 202/185.1 |
| 2012/0146893 | A1* | 6/2012 | Maas et al. | 345/156 |
| 2015/0031446 | A1* | 1/2015 | Colvin et al. | 463/25 |
| 2015/0050990 | A1* | 2/2015 | Colvin et al. | 463/25 |
| 2015/0087389 | A1* | 3/2015 | Ratner et al. | 463/20 |

* cited by examiner

*Primary Examiner* — Forrest M Phillips
(74) *Attorney, Agent, or Firm* — Taylor IP, P.C.

(57) ABSTRACT

The present invention relates to a kiosk that includes a unibody with a plurality of sidewalls defining at least one cage opening within the unibody. A cage system is positioned within a cage opening of the unibody and includes a cage panel with a module opening. A module is placed at least partly within the module opening of the cage system. A method for building such a kiosk is also provided.

20 Claims, 5 Drawing Sheets

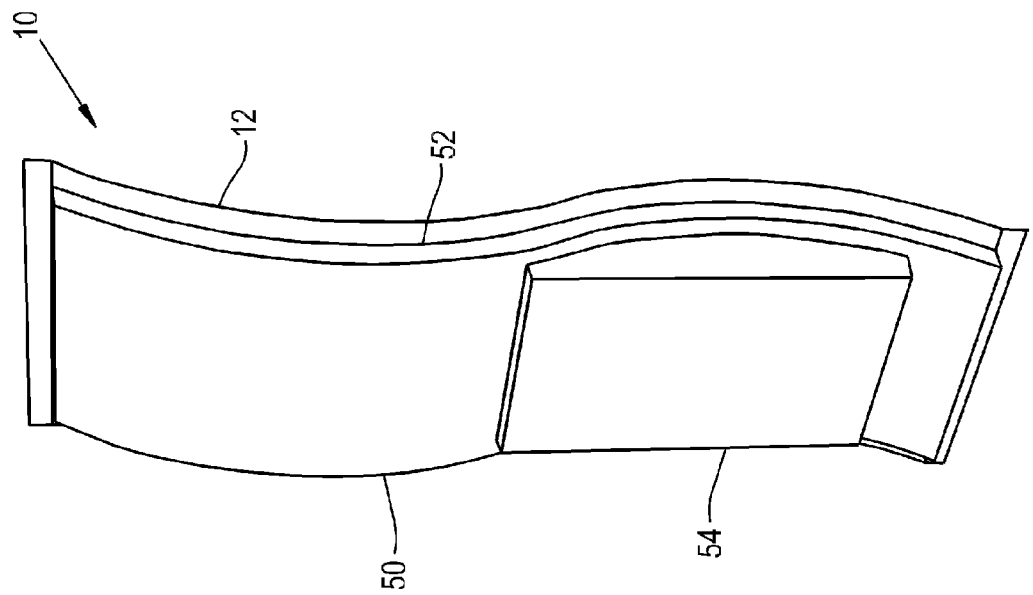
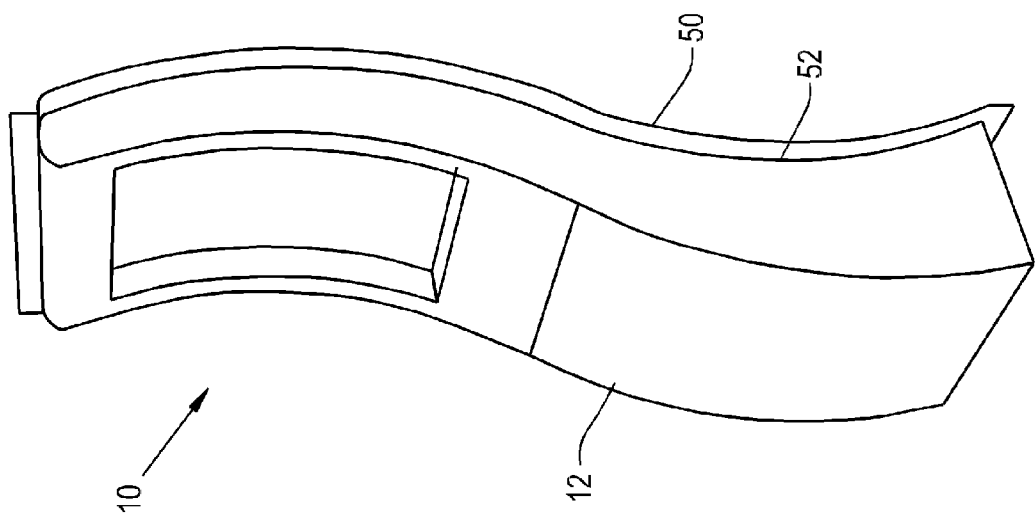
Fig. 7A
Fig. 7B

MULTI-CURVED, UNIBODY FIBERGLASS TOUCHSCREEN KIOSK WITH INTERCHANGEABLE COMPONENT CAGES

CROSS REFERENCE TO RELATED APPLICATIONS

This is a non-provisional application based upon U.S. provisional patent application Ser. No. 61/748,247, entitled "MULTI-CURVED, UNIBODY FIBERGLASS TOUCHSCREEN KIOSK WITH INTERCHANGEABLE COMPONENT CAGES", filed Jan. 2, 2013, which is incorporated herein by reference.

BACKGROUND OF THE INVENTION

1. Field of the Invention

The present invention relates to kiosks.

2. Description of the Related Art

Kiosks are a common sight around the world in places such as malls, airports, libraries etc. Kiosks serve an important role of providing goods and information to users without the need for a human attendant. Utilizing increasingly complex modules, such as touchscreen operated computers, kiosks are able to provide more services to their users and become more valuable to their providers.

Kiosks are not only useful, but can be used for aesthetic purposes. Kiosks are often sized to be used by a standing person, giving the kiosk large surface areas that can be utilized for advertising purposes. To fulfill these design requirements, traditional kiosks were designed as box-like structures made out of metal or polymer.

Recently, the box-like structure has fallen out of favor due to its appearance; consumers are increasingly associating the box-like structure with outdated technology. To satisfy consumers, newer kiosks have been formed into shapes that utilize curves and rounded edges to appeal to consumers' aesthetic tastes. Due to the expense of creating metal molds, there is little variety in the shapes of newer kiosks which makes it difficult for kiosk providers to differentiate their kiosks.

What is needed in the art is a cheaper, aesthetically pleasing kiosk.

SUMMARY OF THE INVENTION

The present invention provides a kiosk that has an interchangeable cage system and can be multi-curved.

The invention in one form is directed to a kiosk having a unibody, a cage system, and a module. The unibody has at least one cage opening formed therein. The cage opening is defined by a plurality of sidewalls. The cage system includes a cage panel with a module opening formed therein. The cage panel is positioned within a corresponding cage opening of the unibody. A module is placed at least partly within the module opening of the cage system.

The invention in another form is directed to a method for building a kiosk. The method includes the steps of providing a mold with a shape and filling the mold with a fiber reinforced polymer to form a unibody. The unibody is then formed into a desired shape and a cage opening is formed within the unibody. A module can then be installed within the cage opening.

An advantage of the present invention is that the modules placed within the kiosk can be easily and cheaply changed without needing to build an entirely new kiosk.

Another advantage is that fiber reinforced polymer kiosks can be produced which are cheaper to manufacture than metal kiosks and can be more aesthetically pleasing.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 7A is a perspective view of an embodiment of the present invention;

FIG. 7B is a different perspective view of an embodiment of the present invention shown in FIG. 7A;

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1:
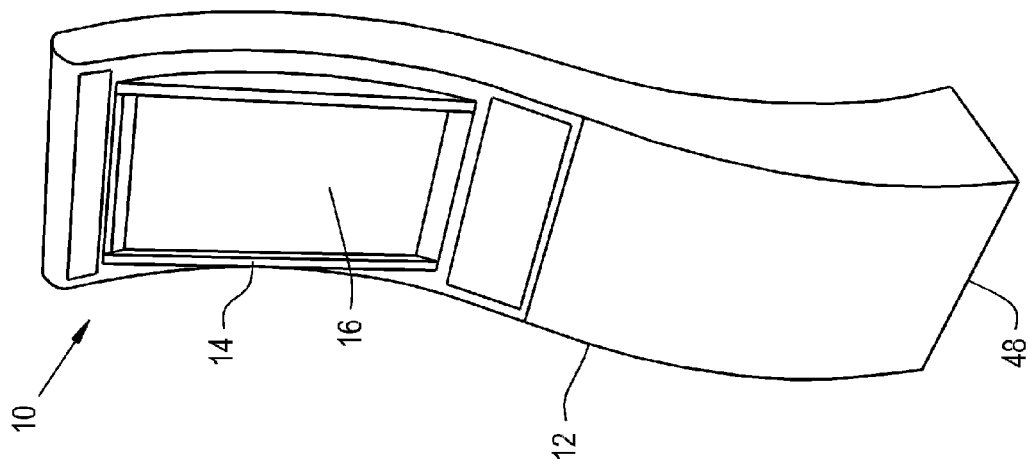
FIG. 1 is a perspective view of an embodiment of the present invention.

Referring now to the drawings, and more particularly to FIG. 1, there is shown a kiosk 10 which generally includes a unibody 12, a cage system 14 placed within the unibody 12, and a module 16 placed at least partly within the cage system 14. As can be seen, the unibody 12 has a multi-curved shape that, when viewed from a side of the unibody 12, resembles a sinusoid, with the module 16 held within an opening of the unibody 12 by the cage system 14.

Figure 2:
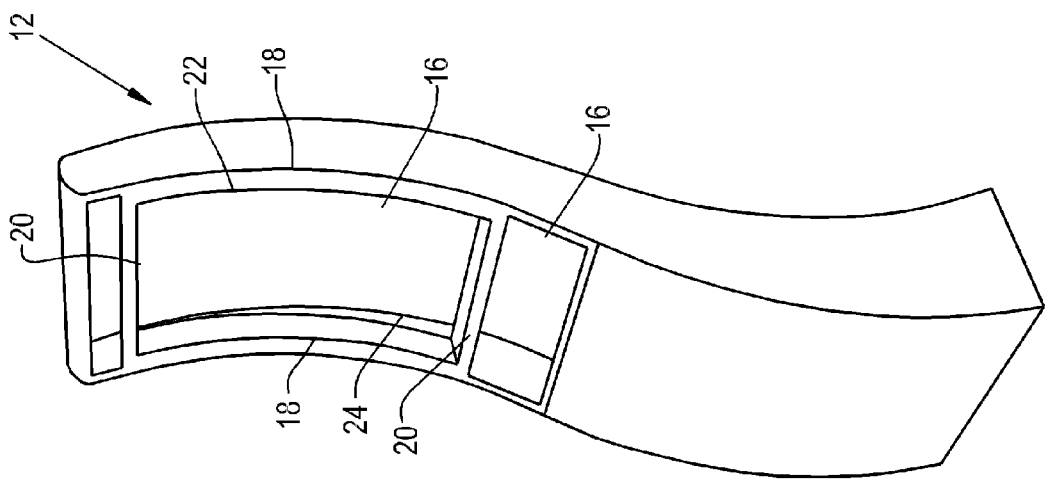
FIG. 2 is a perspective view of a unibody of the present invention.

Referring now to FIG. 2, a unibody 12 of the present invention is shown without any of the invention's other components. The unibody 12 follows a plurality of curvatures, shaped as arcs, to give the unibody 12 a multi-curved shape. Formed within the unibody 12 are multiple cage openings 16 that are defined by a plurality of sidewalls 18, 20. The plurality of sidewalls 18, 20 includes a pair of curved sidewalls 18 that follow the curvature of the unibody 12 throughout the region where the curved sidewalls 18 are present and a pair of straight sidewalls 20 that extend from one of the pair of curved sidewalls 18 to the other. The sidewalls 18, 20 each have at least one edge 22 that can be contacted by the cage system 14 to help hold the cage system 14 within the cage opening 16. A protrusion 24 can be formed on any one of the sidewalls 18, 20 to provide greater surface area for the cage system 14 to contact within the cage opening 16. The unibody 12 can be formed of any material, but it is useful to form the unibody 12 out of a fiber reinforced polymer, such as fiberglass. In addition to their aesthetic properties, fiber reinforced polymers can be easily and inexpensively molded and sculpted to a wide variety of unibody shapes.

Figure 3:
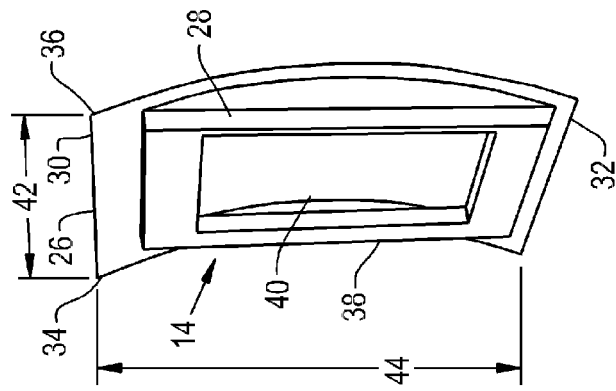
FIG. 3 is a perspective view of a cage system of the present invention.

Referring now to FIG. 3, a cage system 14 of the present invention is shown. The cage system 14 can be formed by a cage panel 26 that is shaped to follow the curvature of the cage opening 16 the cage system 14 will be held within or shaped as a flat panel. The cage panel 26 includes a module opening (not shown) that is sized to hold a module at least partly within the cage system 14. The module opening can be sized to hold a wide variety of modules e.g. touchscreen computers, automated teller machines (ATMs), vending machines, etc. Many different types of modules can be placed within kiosks, and may be either self-powered or require an external power source. If an external power source is required, the kiosk or its components can have other openings provided that allow the module to connect to an external power source. The cage panel 26 can be formed as a solid piece of material with a recess (not shown) to place the module within or the cage panel 26 can have an opening going completely through part of the cage panel 26 that will hold the module. A cage bar 28 can be included in the cage system 14 that extends from one end 30, 34 of the cage panel 26 to an opposite end 32, 36 of the cage panel 26. The cage bar 28 can help hold the module or a frame 38 having an opening 40 for the module between the cage bar 28 and the cage panel 26. The cage panel 26 has multiple lengths 42, 44 extending from one end 30, 34 of the cage panel 26 to the opposite end 32, 36 of the cage panel 26. Any of the lengths 42, 44 of the cage panel 26 can extend beyond an adjacent sidewall 18, 20 of the unibody 12 when the cage system 14 is placed within the unibody 12 to provide a contact surface that will help keep the cage system 14 within the unibody 12. The cage system 14 and its components can be made of any material that is suitable to give the desired shape and properties to its components. One particular concern with kiosks is that the modules are likely to be a target for vandalism or theft. With this in mind, it is useful to create the cage system 14 and its components out of materials that won't break under potentially large forces and/or stresses. It would also be useful to minimize the amount of surface area that can be accessed by a would-be vandal or thief to destroy or remove the module from the cage system or the cage system from the unibody.

Figure 5:
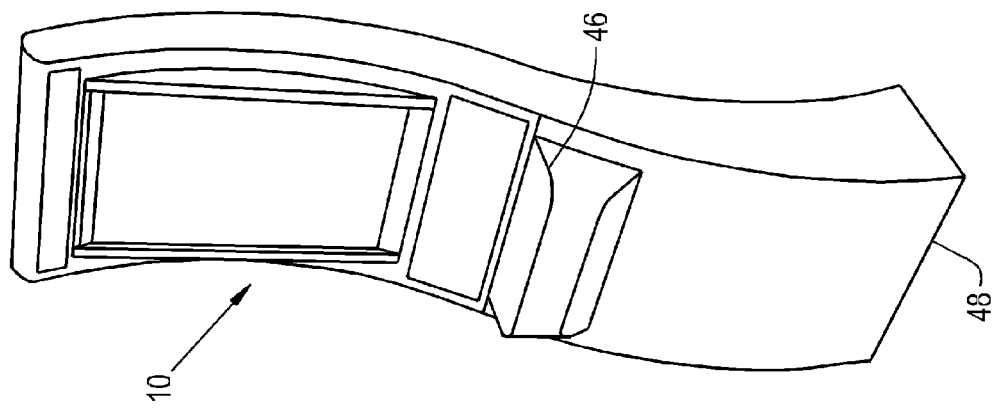
FIG. 5 is a perspective view of an embodiment of the present invention incorporating a different shelf.
Figure 4:
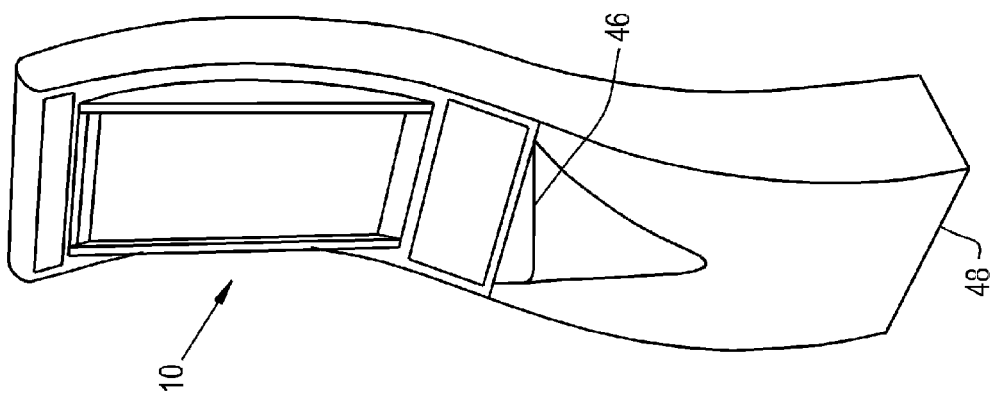
FIG. 4 is a perspective view of an embodiment of the present invention incorporating a shelf.

FIGS. 4 and 5 show a kiosk 10 of the present invention that includes a shelf 46 formed on a front surface 48 of the unibody 12. The shelf 46 can have varying shapes and configurations depending on the kiosk's modules and shape. The shelf 46 can be shaped as a flat surface for the kiosk's users to place things on while using the kiosk 10. The shelf 46 can also be shaped to draw a potential user's attention to the kiosk 10 or for other aesthetic purposes. The shelf 46 can be formed as an integral part of the kiosk 10 or can be a separately attached component that can be removed and changed as desired.

Figure 6:
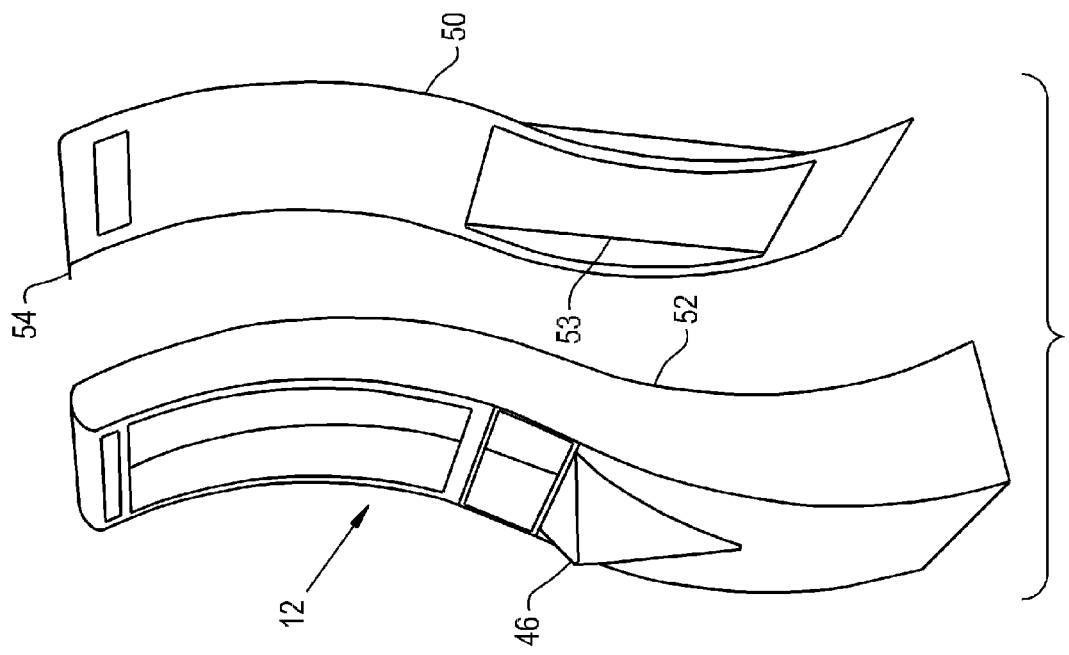
FIG. 6 is an exploded view of a unibody of the present invention and an accompanying securing panel.

FIG. 6 shows a unibody 12 with a shelf 46 and a separated securing panel 50 that can be attached to a rear 52 of the unibody 12. The securing panel 50 can be shaped to cover all of the rear 52 of the unibody 12 or only a portion of the unibody 12 containing components that need extra securing within the kiosk 10 or that the kiosk's provider wants to be covered. Shown in the securing panel 50 is a recess 53 that can hold components of the kiosk, such as a power supply. At the top of the securing panel 50 is a pin 54 that can be placed with mating means (not shown) to secure the securing panel 50 to the rear 52 of the unibody 12.

FIGS. 7A and 7B show different perspective views of a kiosk 10 with a securing panel 50 attached to a rear 52 of the kiosk's unibody 12. Attached to the securing panel 50 is a power assembly 54 that can power a module within the kiosk 10. The cables going from the power assembly 54 to the module can also be hidden within the kiosk 10 by the securing panel 50. To change modules within the kiosk 10, the securing panel 50 can be removed at a location of the module and a cage system holding the module can be removed. The module can then be taken out of the cage system and replaced with a new module, or a new module and cage system can be installed in the kiosk. The securing panel 50 can be made of any suitable materials that give a desired shape, but as previously mentioned it would be useful to form the securing panel 50 out of high strength materials to discourage vandalism and/or theft of the kiosk's components.

Figure 8A:
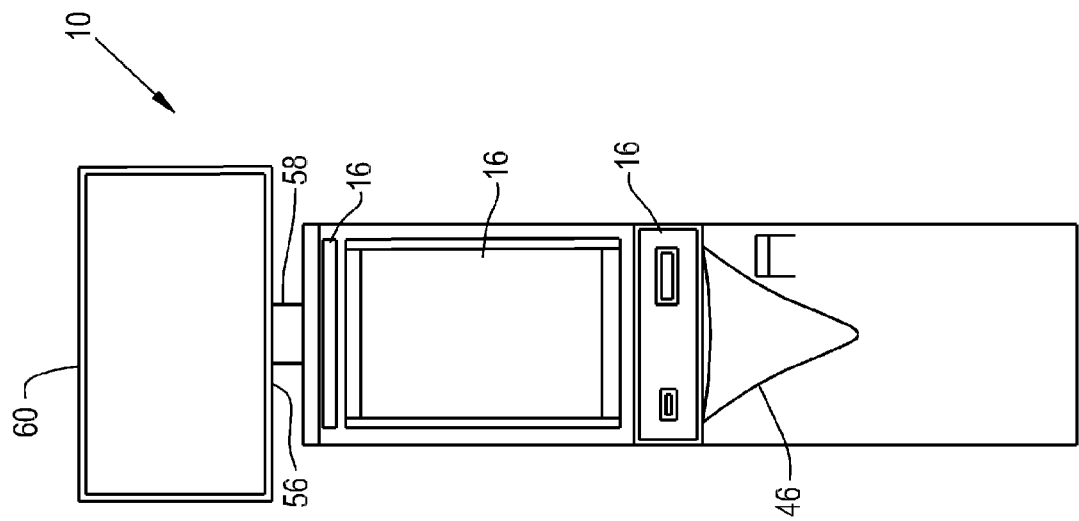
FIG. 8A is a perspective view of an embodiment of the present invention incorporating a media assembly.
Figure 8B:
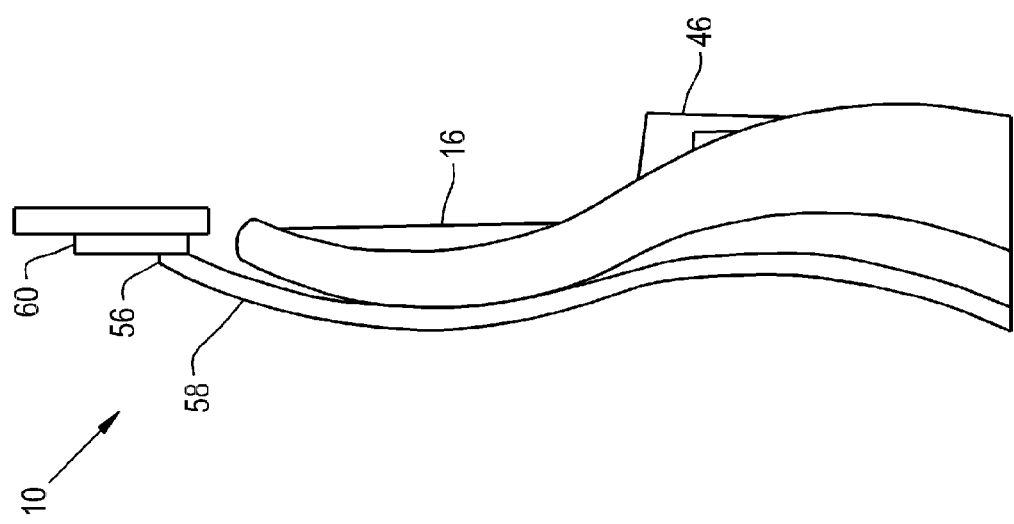
FIG. 8B is a different perspective view of an embodiment of the present invention shown in FIG. 8A.
Figure 9:
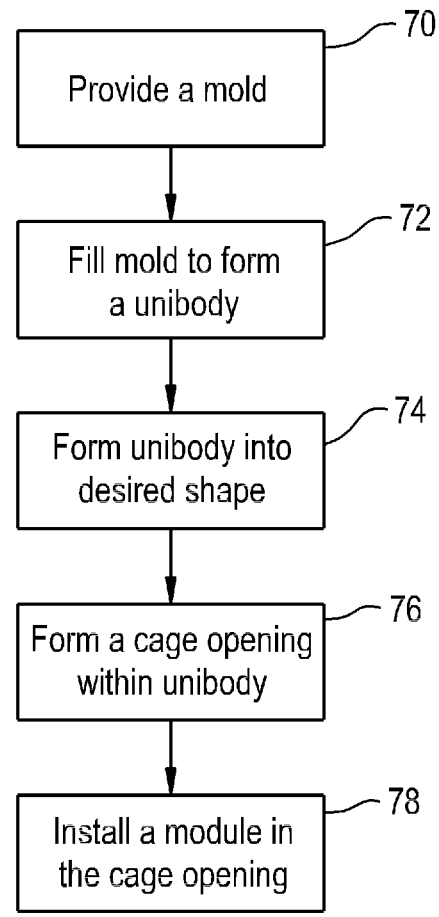
FIG. 9 is a flowchart diagram illustrating a method of the present invention.

FIGS. 8A and 8B show different perspective views of a kiosk 10 with multiple modules 16 installed and a shelf 46. The kiosk 10 also includes a media assembly 56 attached to the rear of the kiosk 10. The media assembly 56 includes a media stand 58 that attaches the media assembly 56 to the kiosk 10 and raises the media assembly 56 above the kiosk, as well as a media device 60 at the top of the media assembly 56. The media device 60 can be any type of device that might be useful to include with a kiosk e.g. monitors, speakers, fans, etc. The media assembly 56 can also be removable from the kiosk 10 for easy replacement or can be permanently attached to the kiosk 10.

To produce a kiosk of the present invention, a mold is provided that corresponds to the desired shape of the kiosk to be produced (block 70). The inside of the mold is sprayed with a mold release agent to ensure that material sprayed on the mold's interior will release from the mold walls. Mold release agents can include various waxes and polyvinyl alcohol. Optionally, a gelcoat can be applied to the interior of the mold after the mold release agent is applied. The gelcoat can give the kiosk's surfaces a more desirable finish. The mold is then filled with alternating layers of resin and a fiber reinforced polymer, such as fiberglass, until the desired thickness and shape of the kiosk is produced, at which point the resin is allowed to cure to form a unibody of fiberglass (block 72). After the resin has cured, the unibody is removed from the mold and can be further sculpted to add more details to the unibody or produce features that would be difficult to produce during the molding process (block 74). Ways of sculpting the unibody can include known forms of cutting and etching. One aesthetically pleasing feature that can be sculpted into the unibody is rounded edges, which give the kiosk a softer, more approachable look. Edges of the unibody can be rounded by known methods such as grinding. A cage opening is formed within the unibody and is sized to hold a cage system for a module or just a module (block 76). After the cage opening has been formed within the unibody, a module is installed within the cage opening (block 78). The module can be installed within a cage system for interchangeability and protection before being installed in the cage opening.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A kiosk, comprising:
  a unibody having at least one cage opening formed therein defined by a plurality of sidewalls;

a cage system comprising a cage panel having a module opening formed therein, said cage panel being positioned within a corresponding said cage opening; and
a module placed at least partly within said module opening of said cage system.

2. The kiosk of claim 1, wherein said unibody is comprised of a fiber reinforced polymer.

3. The kiosk of claim 2, wherein said cage system further comprises at least one cage bar extending from one end of said cage panel to an opposite end of said cage panel.

4. The kiosk of claim 3, wherein said unibody has a multi-curved shape, said multi-curved shape following a plurality of curvatures to form a sinusoidal shape when viewed from a side of said unibody.

5. The kiosk of claim 4, wherein said plurality of sidewalls includes a pair of curved sidewalls following at least one of said plurality of curvatures of said unibody and a pair of straight sidewalls.

6. The kiosk of claim 5, wherein said cage system further comprises a frame between said cage panel and said at least one cage bar, said frame holding said module at least partly within said module opening.

7. The kiosk of claim 6, wherein said cage panel of said cage system has a cage shape that follows at least one of said plurality of curvatures of said unibody.

8. The kiosk of claim 7, further comprising a securing panel that secures said cage system within said at least one cage opening.

9. The kiosk of claim 8, wherein said cage panel of said cage system has at least one length that extends beyond an edge of at least one of said plurality of side walls.

10. The kiosk of claim 9, wherein at least one of said pair of curved sidewalls has a protrusion formed thereon, said protrusion having a protruding edge that is said edge of said at least one of said pair of curved sidewalls.

11. The kiosk of claim 10, wherein said unibody has a front surface and further comprises a shelf on the front surface.

12. The kiosk of claim 11, wherein said module is a touchscreen device.

13. The kiosk of claim 12, further comprising a media assembly connected to a rear of said unibody, said media assembly comprising a media stand and a media device connected to an end of said media stand.

14. The kiosk of claim 13, wherein a plurality of edges of said unibody are rounded.

15. A method of building a kiosk, comprising the steps of:
providing a mold having a shape;
filling said mold with a fiber reinforced polymer to form a unibody;
forming said unibody into a desired shape;
forming at least one cage opening within said unibody; and
installing a module within said at least one cage opening.

16. The method of claim 15, wherein said desired shape is that of a multi-curved unibody having a front surface that follows a plurality of curvatures and has a sinusoidal shape when viewed from a side of said front surface, a pair of side surfaces that are complementary to said front surface and a rear surface at least partially covering a rear of said unibody that is complementary to said front surface and said pair of side surfaces to enclose a volume within said unibody.

17. The method of claim 16, further comprising the step of placing said module in a cage system.

18. The method of claim 17, further comprising the step of installing a securing panel on to the kiosk that secures said cage system within said kiosk.

19. The method of claim 18, further comprising the step of rounding a plurality of edges of at least one of said front surface, said pair of side surfaces or said rear surface.

20. The method of claim 19, wherein said fiber reinforced polymer is fiberglass.

* * * * *